(12) United States Patent
Noda et al.

(10) Patent No.: US 8,530,898 B2
(45) Date of Patent: Sep. 10, 2013

(54) DISPLAY DEVICE

(75) Inventors: Takeshi Noda, Mobara (JP); Takuo Kaitoh, Mobara (JP)

(73) Assignees: Hitachi Displays, Ltd., Chiba (JP); Panasonic Liquid Crystal Display Co., Ltd., Hyogo-Ken (JP)

( * ) Notice: Subject to any disclaimer, the term of this patent is extended or adjusted under 35 U.S.C. 154(b) by 286 days.

(21) Appl. No.: 12/912,799

(22) Filed: Oct. 27, 2010

(65) Prior Publication Data

US 2011/0101357 A1 May 5, 2011

(30) Foreign Application Priority Data

Oct. 29, 2009 (JP) ................... 2009-249511

(51) Int. Cl.
*H01L 29/04* (2006.01)
*H01L 29/10* (2006.01)
*H01L 31/00* (2006.01)

(52) U.S. Cl.
USPC .............. 257/59; 257/83; 257/431; 257/507; 257/E33.053

(58) Field of Classification Search
USPC ...... 257/59, 83, 431, 507, E33.053; 438/149
See application file for complete search history.

(56) References Cited

U.S. PATENT DOCUMENTS

| 6,469,317 B1 | 10/2002 | Yamazaki et al. |
| 2009/0207153 A1* | 8/2009 | Kunii et al. .................... 345/175 |
| 2009/0218574 A1 | 9/2009 | Noda et al. |
| 2009/0236602 A1* | 9/2009 | Kato .............................. 257/66 |
| 2011/0069254 A1* | 3/2011 | Takama et al. .................. 349/62 |

FOREIGN PATENT DOCUMENTS

| JP | 2000-236097 | 8/2000 |
| JP | 2009-206434 | 9/2009 |

* cited by examiner

*Primary Examiner* — Michelle Mandala

(74) *Attorney, Agent, or Firm* — Antonelli, Terry, Stout & Kraus, LLP.

(57) ABSTRACT

A display device which uses a TFT having a gate electrode film thereof arranged on a light source side can also suppress the increase of parasitic capacitance while suppressing the generation of a light leakage current. On at least one end of the TFT, between a high concentration region which constitutes a source region or a drain region and a channel region, a first low concentration region which is arranged on a high concentration region side and exhibits low impurity concentration and a second low concentration region which exhibits impurity concentration even lower than the impurity concentration of the first low concentration region are provided in this order.

7 Claims, 14 Drawing Sheets

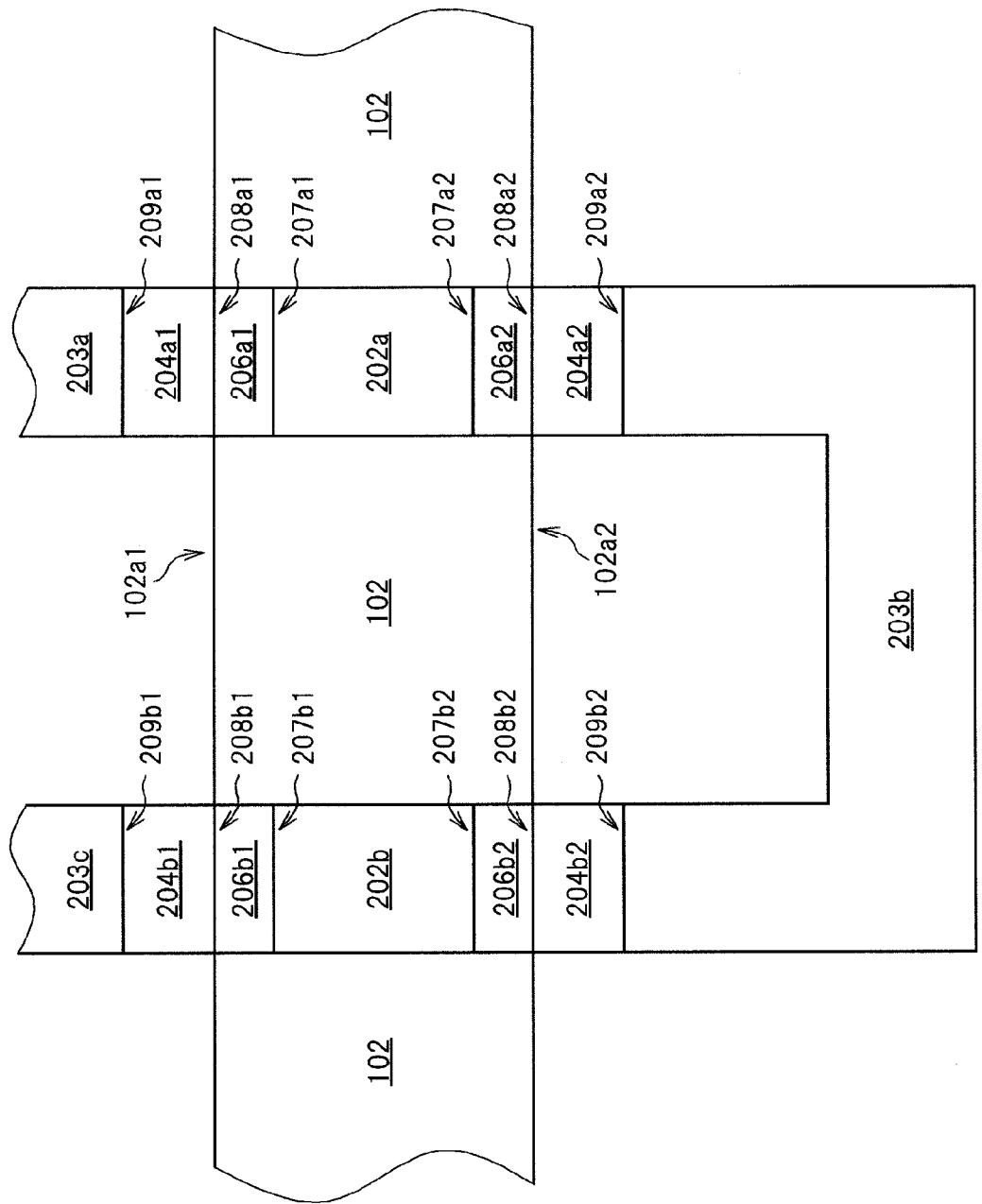

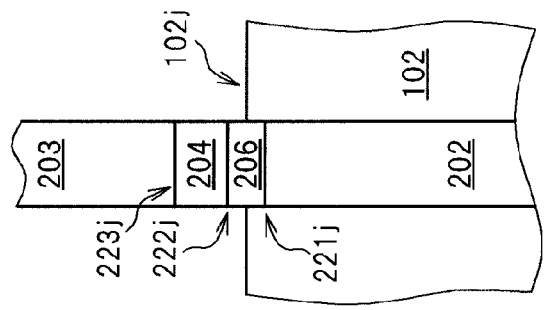
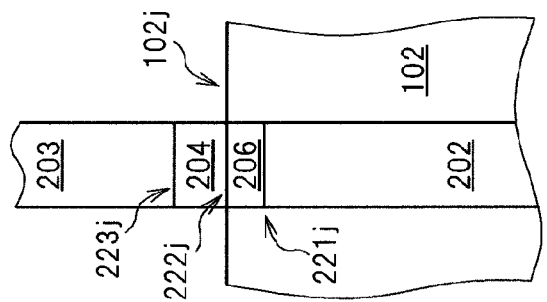
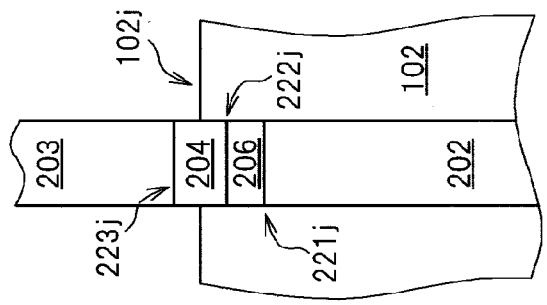
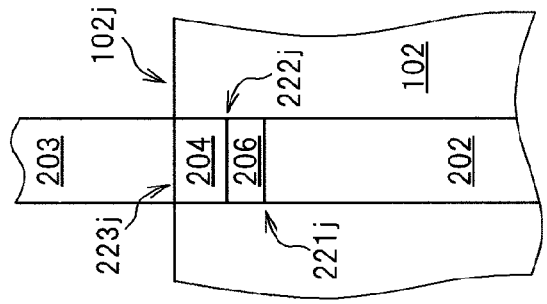
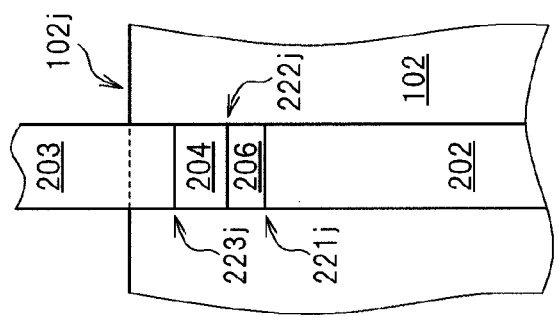

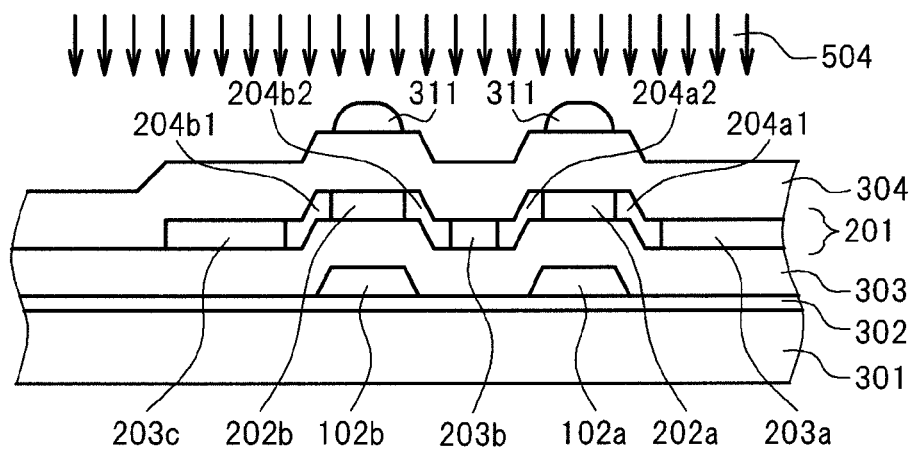
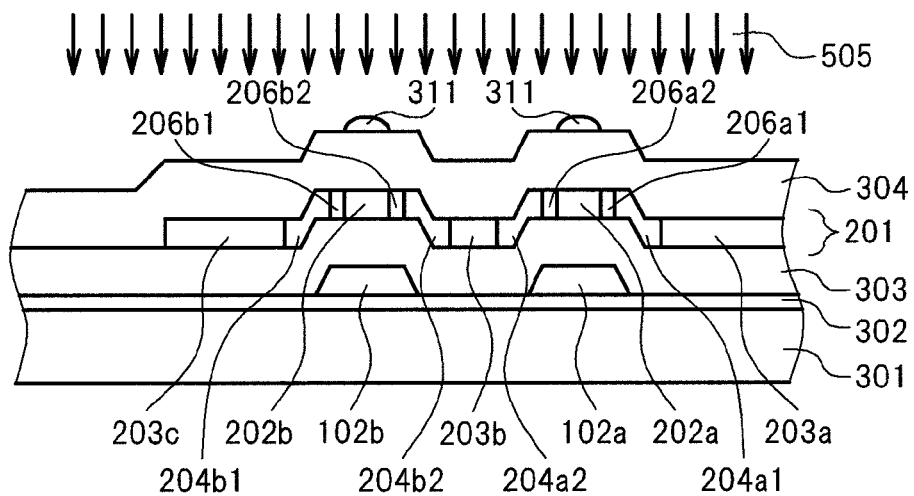

DISPLAY DEVICE

CROSS-REFERENCE TO RELATED APPLICATION

The present application claims priority from Japanese patent application JP 2009-249511 filed on Oct. 29, 2009, the content of which is hereby incorporated by reference into this application.

BACKGROUND OF THE INVENTION

1. Field of the Invention

The present invention relates to a display device, and more particularly to the enhancement of a display quality in a display device which performs a display control of a pixel using a thin film transistor (hereinafter simply referred to as "TFT").

2. Description of the Related Art

In a display device such as a liquid crystal display device, a display control of each pixel is performed using a TFT or the like. With respect to the TFT, there has been generally known the bottom gate structure where a gate electrode is positioned closer to a light source than a semiconductor film. In radiating light to the TFT having such structure from a light source such as a backlight, the gate electrode per se functions as a light blocking mask for a semiconductor film which faces the gate electrode in an opposed manner.

When light is radiated to the semiconductor film, hole electron pairs are generated, and the degree of generation of the hole electron pairs is, particularly in case of a TFT which uses polycrystalline silicon, remarkably lowered along with the increase of the concentration of a carrier. Accordingly, in a channel region, or a depletion layer region which is formed in a PN junction portion in the vicinity of the channel region, hole electron pairs are liable to be easily generated compared to a source region or a drain region doped with high concentration of an impurity which constitutes a carrier. Unless these regions are sufficiently shielded from light by the gate electrode which faces these regions in an opposed manner, hole electron pairs are generated so that a light leakage current is generated thus increasing an OFF current. Hereinafter, the source region, the drain region and the like are collectively referred to as a high concentration region.

Further, as the structure which suppresses a leak current, the LDD (Lightly Doped Drain) structure has been generally known. The LDD structure is configured such that between a channel region and a high concentration region, a region which is doped with low concentration of an impurity compared to the high concentration region (hereinafter referred to as "low concentration region") is formed.

As the related art which discloses such techniques, JP 2000-236097 A (patent document 1) and JP 2009-206434 A (patent document 2) are named.

SUMMARY OF THE INVENTION

At the time of turning off a gate voltage where a low voltage is applied to a gate electrode, a potential difference is generated in a semiconductor film. In the LDD structure, a low concentration region is formed between a high concentration region and a channel region, and a potential of the low concentration region assumes a value between a potential of the high concentration region and a potential of the channel region. Accordingly, an electric field which is generated in the vicinity of an edge of the channel region at the time of turning off the gate voltage becomes small compared to a case where the low concentration region is not provided. Due to such structure, the movement of holes and electrons is suppressed so that the generation of a leak current is suppressed.

Also in the LDD structure which is the structure where a leak current is suppressed, when a channel region and a low concentration region are not sufficiently shielded from light by a gate electrode, along with the radiation of light, hole electron pairs are generated so that a light leakage current is generated. In an attempt to increase the carrier concentration in the low concentration region for suppressing the light leakage current, an electric field in the vicinity of a boundary between a channel region and a low concentration region is increased so that, at the time of turning off a gate voltage, a threshold value of a voltage which can be maintained between the high concentration regions which are positioned on both sides of the channel region, that is, a source-drain withstand voltage is lowered.

FIG. 12 is a view showing one example of the LDD structure of a TFT according to the related art. As shown in FIG. 12, a semiconductor film 201 is positioned above a gate electrode film 102 which becomes a gate electrode, by way of a gate insulation film 303. Between a channel region 202 which faces the gate electrode film 102 and high concentration regions 203 which are positioned outside the channel region 202, low concentration regions 220 are positioned respectively. The channel region 202 is shielded from light entered from a lower side in the drawing by the gate electrode film 102. To the contrary, the low concentration regions 220 are only partially shielded from light by the gate electrode film 102. Accordingly, only a portion of the low concentration region 220 faces the gate electrode film 102 in an opposed manner and hence, although parasitic capacitance is suppressed, shielding of the low concentration region 220 from light is insufficient thus bringing about the structure where the suppression of a light leakage current is insufficient.

On the other hand, when a channel region and low concentration regions are sufficiently shielded from light by a gate electrode, although a light leakage current is suppressed, an area within which a semiconductor film and a gate electrode film face each other in an opposed manner is increased so that parasitic capacitance is increased. Further, in general, when the opposing areas of the semiconductor film and the gate electrode film are equal, the higher the carrier concentration of the semiconductor film, the larger the parasitic capacitance becomes. In holding a pixel voltage at the time of turning off a gate voltage, the pixel voltage is largely lowered due to the large parasitic capacitance thus giving rise to a new cause of a defective display. On the other hand, when the concentration of impurity which becomes a carrier in a low concentration region is lowered so as to suppress the increase of the parasitic capacitance, an electric field in the vicinity of a boundary between the low concentration region and a high concentration region is increased and hence, the suppression of a light leakage current becomes impossible.

FIG. 13 shows another example of the LDD structure of a TFT according to the related art. In the TFT shown in FIG. 13, differently from the TFT shown in FIG. 12, a channel region 202 and low concentration regions 220 are sufficiently shielded from light entered from a lower side in the drawing by a gate electrode film 102. However, not only the low concentration regions 220 but also portions of high concentration regions 203 face the gate electrode film 102 in an opposed manner. Accordingly, sufficient light shielding can be realized so that a light leakage current can be sufficiently suppressed. However, the low concentration regions 220 and the parts of the high concentration regions 203 face the gate electrode film 102 in an opposed manner thus giving rise to the structure with large parasitic capacitance.

As has been explained above, in the LDD structure of the TFT according to the related art, the sufficient suppression of a light leakage current cannot be realized when the increase of the parasitic capacitance is suppressed, while the increase of the parasitic capacitance is brought about when the light leakage current is suppressed.

Accordingly, it is an object of the invention to provide a display device which, in a state where a TFT having a gate electrode thereof arranged on a light source side has the LDD structure, can also suppress the increase of parasitic capacitance while suppressing the generation of a light leakage current.

(1) To overcome the above-mentioned drawbacks, according to one aspect of the invention, there is provided a display device which includes: a semiconductor film which is arranged between a video signal line and a pixel electrode and is provided with one or more channel regions by way of impurity doped regions which are doped with a predetermined impurity; a light source which is arranged on one side of the semiconductor film and generates light; and one or more gate electrodes which are arranged between the semiconductor film and the light source, and face the one or more channel regions in an opposed manner respectively, wherein out of the impurity doped regions, at least one impurity doped region arranged adjacent to the one or more channel regions is a low concentration region which is doped with the predetermined impurity or with an impurity different from the predetermined impurity at impurity concentration lower than impurity concentration outside the at least one impurity doped region, and the low concentration region includes a first low concentration region which is arranged on an outer side thereof and a second low concentration region which is arranged closer to a channel region side than the first low concentration region is and exhibits impurity concentration lower than impurity concentration of the first low concentration region.

(2) In the display device described in (1), out of the impurity doped regions, all impurity doped regions adjacent to one or more channel regions may be low concentration regions.

(3) In the display device described in (1) or (2), the low concentration region may be constituted of the first low concentration region and the second low concentration region.

(4) In the display device described in (3), at least a portion of the first low concentration region may expand outside a region of the semiconductor film which faces the gate electrode in an opposed manner.

(5) In the display device described in (4), the second low concentration region may be covered with the region of the semiconductor film which faces the gate electrode in an opposed manner.

(6) In the display device described in any one of (1) to (5), the impurity concentration of the first low concentration region may be set to $1 \times 10^{18}$ to $1 \times 10^{19}$ atom/cm$^3$, and the impurity concentration of the second low concentration regions may be set to not more than 50% of the impurity concentration of the first low concentration region.

(7) In the display device described in any one of (1) to (6), the semiconductor film may include two channel regions.

According to the invention, by providing a region where the concentration of impurity which becomes a carrier is even lower than the low concentration region between the channel region and the low concentration region, it is possible to provide the display device which can suppress the increase of parasitic capacitance while suppressing the generation of a light leakage current.

BRIEF DESCRIPTION OF THE DRAWINGS

In the accompanying drawings:

FIG. 5 is an enlarged plan view showing the vicinity of B in FIG. 3;

FIG. 7 is an enlarged plan view showing relative positions of a semiconductor film and a gate electrode film on a TFT substrate according to a second embodiment of the invention;

FIG. 9C is a view showing a process of manufacturing the TFT substrate of the display device according to the second embodiment of the invention;

FIG. 9D is a view showing a process of manufacturing the TFT substrate of the display device according to the second embodiment of the invention;

DETAILED DESCRIPTION OF THE INVENTION

Hereinafter, embodiments of the invention are explained in conjunction with drawings.

First Embodiment

Figure 1:
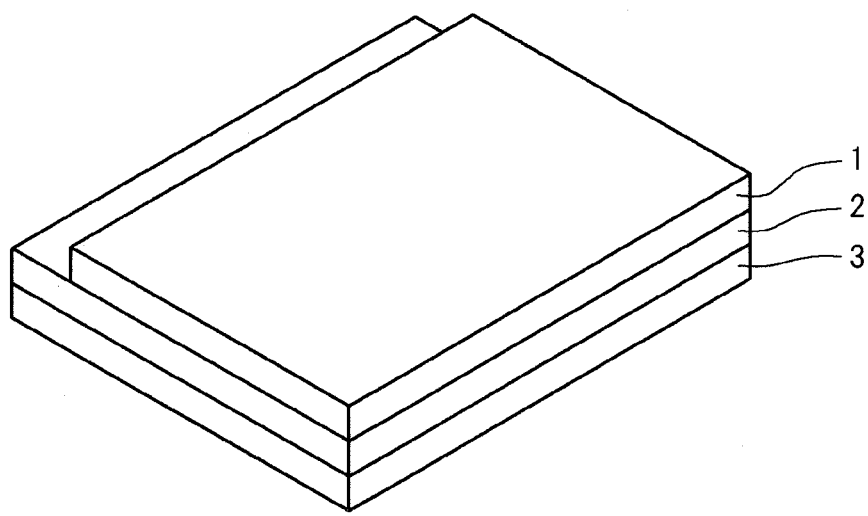
FIG. 1 is a perspective view of a whole liquid crystal display device according to an embodiment of the invention.

A display device according to a first embodiment of the invention is a kind of IPS (In-Plane Switching) liquid crystal display device. FIG. 1 is a perspective view of the whole liquid crystal display device according to this embodiment of the invention. As shown in FIG. 1, the liquid crystal display device includes a TFT substrate 2 on which scanning signal lines, video signal lines, TFTs, pixel electrodes, common electrodes and the like are arranged, a filter substrate 1 which faces the TFT substrate 2 in an opposed manner and on which color filters are mounted, a liquid crystal material which is sealed in a region sandwiched between both substrates, and a backlight 3 which is arranged on a TFT substrate side. In the TFT substrate 2, the TFTs and the like are arranged on a transparent substrate formed of a glass substrate or the like.

Figure 2:
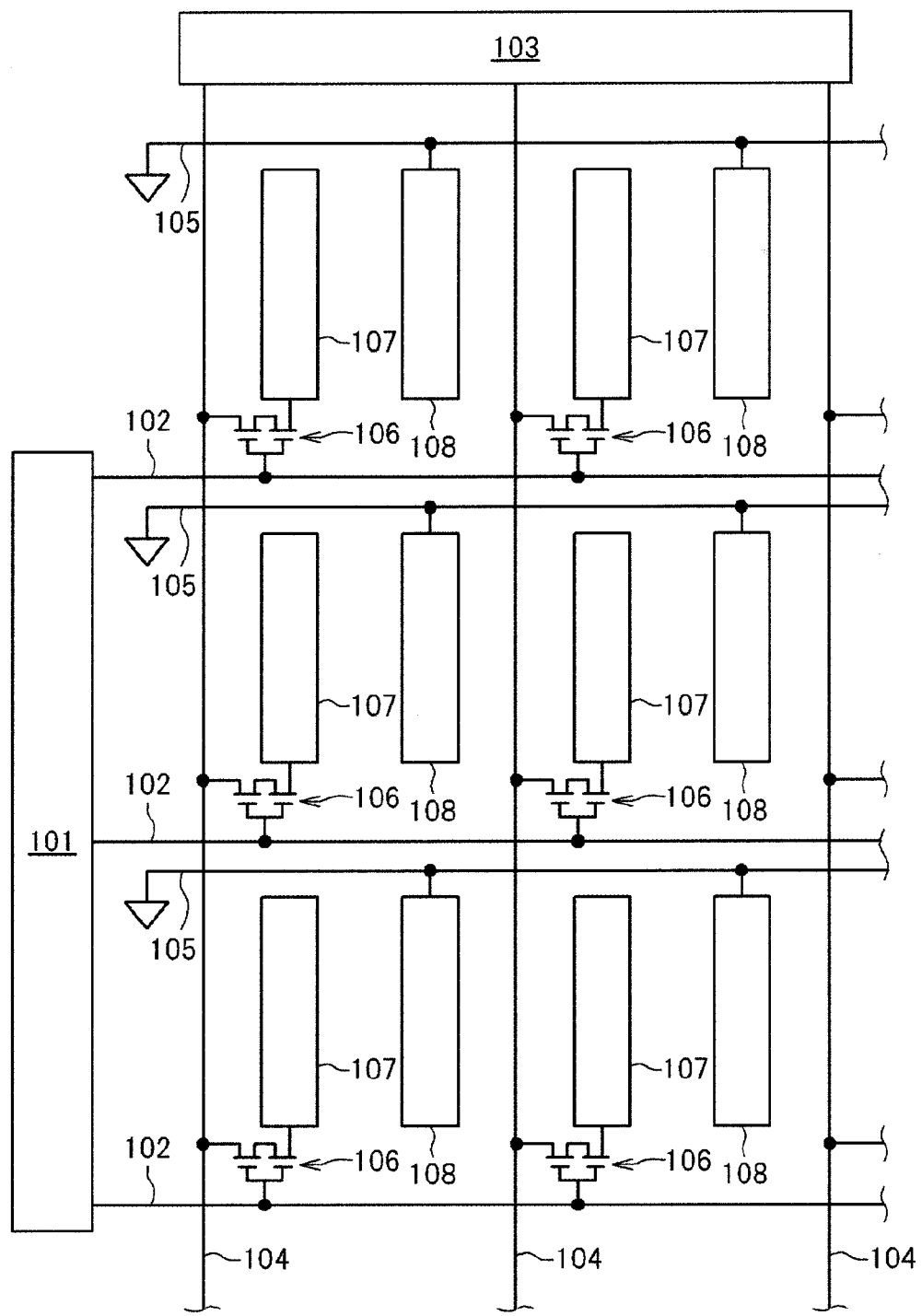
FIG. 2 is an equivalent circuit diagram of a TFT substrate of the liquid crystal display device according to the embodiment of the invention.

FIG. 2 is an equivalent circuit diagram of the TFT substrate 2 of the liquid crystal display device according to this embodiment of the invention.

As shown in FIG. 2, on the TFT substrate 2, a large number of linear gate electrode films 102 (gate signal lines) which are connected to a gate driver 101 extend in the lateral direction in the drawing at an equal interval between the films as scanning signal lines, and a large number of video signal lines 104 which are connected to a data driver 103 extend in the longitudinal direction in the drawing at an equal interval between the lines. Pixel regions which are arranged in a matrix array are respectively defined by these gate electrode films 102 (gate signal lines) and the video signal lines 104. Further, common signal lines 105 extend in the lateral direction in the drawing parallel to the respective gate electrode films 102 (gate signal lines).

A TFT 106 is formed in a corner of the pixel region which is defined by the gate electrode film 102 (gate signal line) and the video signal line 104, and the TFT 106 is connected to the video signal line 104 and the pixel electrode 107. Although a gate electrode of the TFT 106 is depicted in FIG. 2 such that the gate electrode is connected to the gate electrode film 102 (gate signal line), as described later, in an actual circuit, the gate electrode of the TFT 106 is formed from a part of the gate electrode film 102. Each pixel circuit includes the pixel electrode 107 and a common electrode 108 which face each other in an opposed manner and form a pair. In FIG. 2, each pixel circuit adopts the dual gate structure where two TFTs are connected in series.

In the above-mentioned circuit constitution, by applying a reference voltage to the common electrode 108 of each pixel circuit via the common signal line 105, and by selectively applying a gate voltage to the gate electrode film 102 (gate signal line), an electric current which flows in the TFT 106 is controlled. Further, in response to the selectively applied gate voltage, a voltage of a video signal supplied to the video signal line 104 is selectively applied to the pixel electrode 107. Accordingly, the alignment of liquid crystal molecules or the like is controlled thus performing a screen display.

Figure 3:
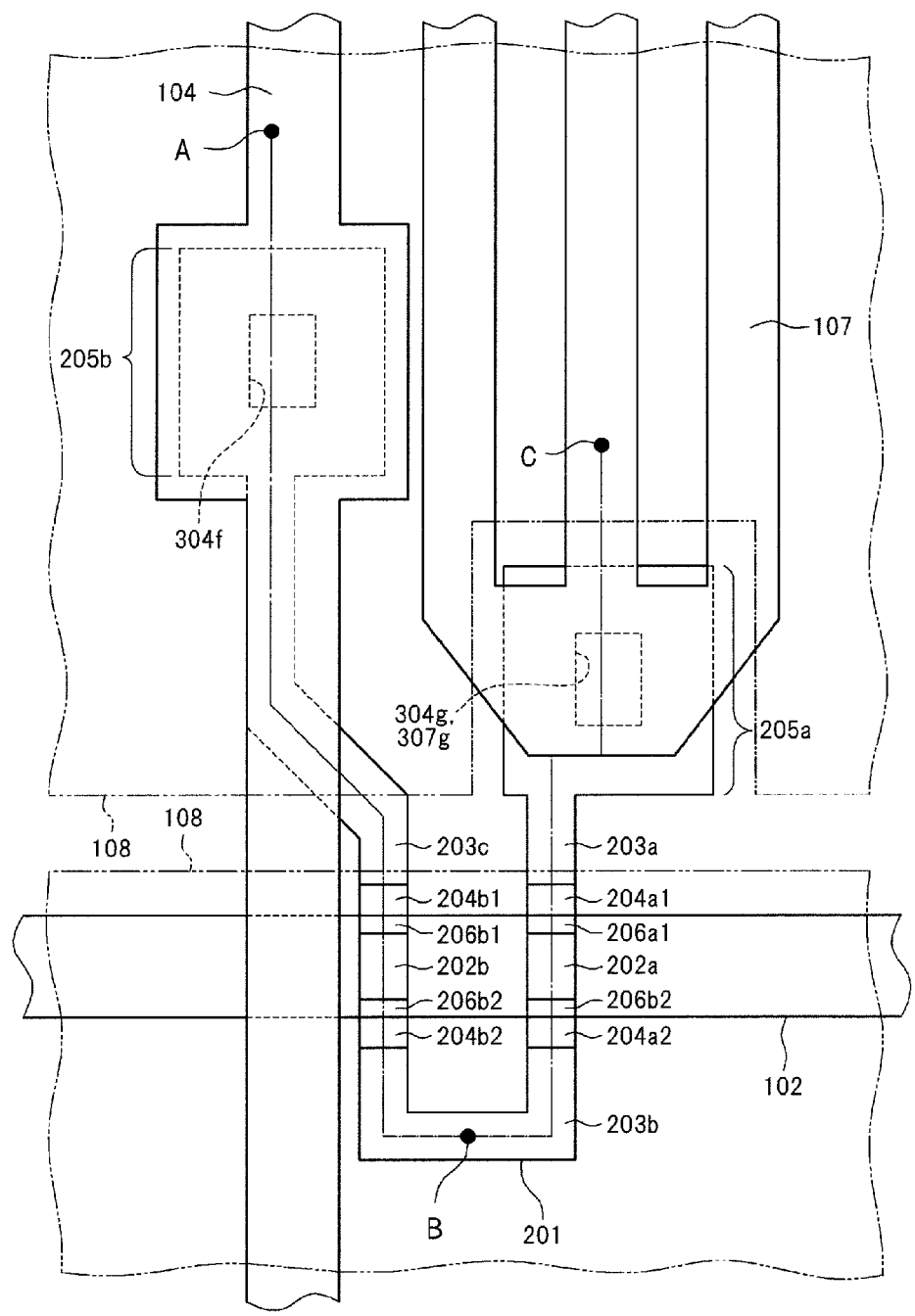
FIG. 3 is an enlarged plan view showing one pixel region on the TFT substrate according to the embodiment of the invention.

FIG. 3 is an enlarged plan view showing one pixel region on the TFT substrate 2 according to this embodiment of the invention. FIG. 3 shows a shape of a semiconductor film 201. A contact hole 304f is formed in an interlayer insulation film 304 (not shown in the drawing) which is positioned above a PAD portion 205b arranged at one end of the semiconductor film 201 on an A side in the drawing. The PAD portion 205b is connected with the video signal line 104 using a material having high electric conductivity such as aluminum. On the other hand, a contact hole 304g is also formed in the interlayer insulation film 304 (not shown in the drawing) which is positioned above a PAD portion 205a formed at one end of the interlayer insulation film 304 on a C side in the drawing. Further, a contact hole 307g is also formed in a passivation insulation film 305, a leveling film 306 and an insulation film 307 (not shown in the drawing) which are positioned above the interlayer insulation film 304. The PAD portion 205a is connected to an electrode 320 (not shown in the drawing). Further, the electrode 320 is also connected to the pixel electrode 107 which is positioned above the common electrode 108 and is electrically disconnected from the common electrode 108. Below the semiconductor film 201, the gate electrode film 102 (gate signal line) is positioned by way of a gate insulation film 303 (not shown in the drawing) (see FIG. 4).

Between the PAD portions 205b, 205a positioned at both ends of the semiconductor film 201, the semiconductor film 201 is formed into a strip shape having an equal strip width. From the PAD portion 205b positioned at the end of the semiconductor film 201 on the A side in the drawing, the strip-shaped semiconductor film 201 extends downward parallel to the video signal line 104. Thereafter, the semiconductor film 201 extends downward and away from the video signal line 104 forming an oblique line shape and, again, extends parallel to the video signal line 104. Then, the semiconductor film 201 perpendicularly intersects with the gate electrode film 102 which is positioned below the semiconductor film 201 and has a strip shape by way of the gate insulation film 303 and, thereafter, the semiconductor film 201 is folded and perpendicularly intersects with the gate electrode film 102 again (see FIG. 5). Then, the strip-shaped semiconductor film 201 extends parallel to the video signal line 104 and forms the PAD portion 205a arranged at the end on the C side in the drawing.

The semiconductor film 201 includes channel regions 202 and high concentration regions 203 which are doped with impurity for ensuring conductivity. Between both regions 202, 203, a first low concentration region 204 and a second low concentration region 206 are positioned. The first low concentration region 204 is positioned on a high concentration region 203 side and is doped with impurity of concentration lower than impurity concentration of the high concentration region 203, and the second low concentration region 206 is positioned on a channel region 202 side and is doped with impurity of concentration even lower than impurity concentration of the first low concentration region 204. Hereinafter, the first low concentration region 204 and the second low concentration region 206 are collectively referred to as "low concentration region".

Figure 4:
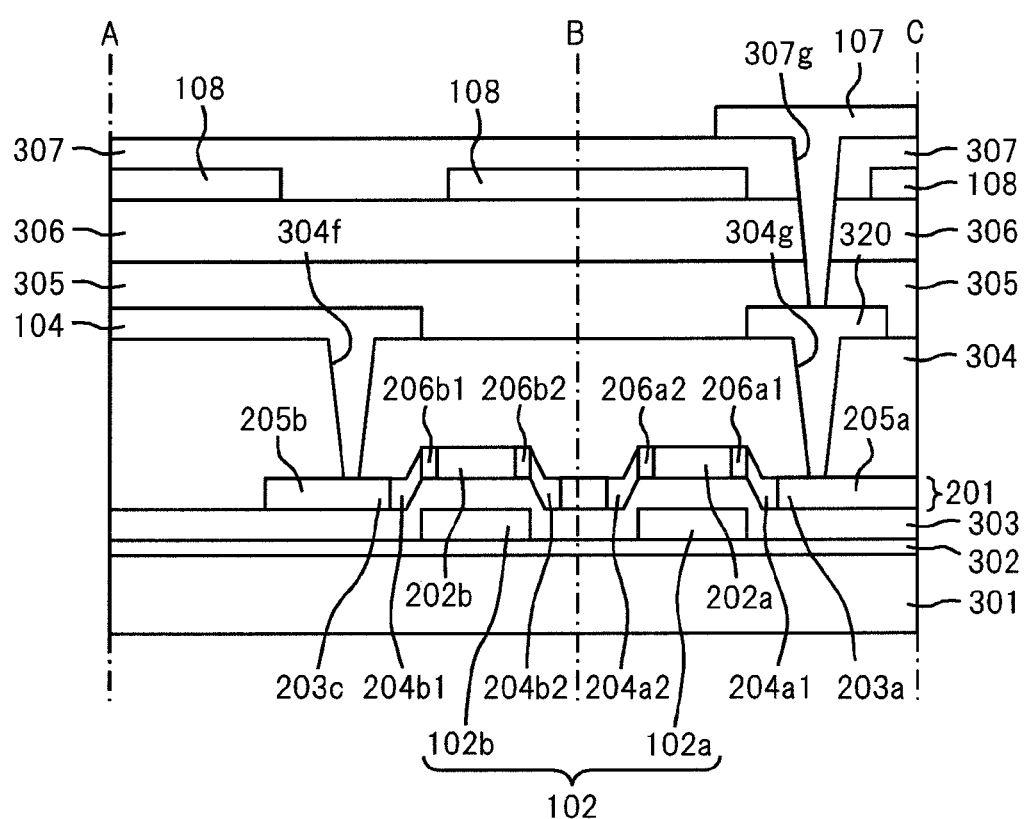
FIG. 4 is a cross-sectional view taken along an A-B-C line in FIG. 3.

FIG. 4 is a cross-sectional view taken along an A-B-C line in FIG. 3. In FIG. 4, the backlight 3 (not shown in the drawing) is positioned below a transparent substrate 301 in the drawing and hence, the gate electrode film 102 plays a role of, in addition to a role of applying a gate voltage, shielding regions of the semiconductor film 201 which face a gate electrode film 102 in an opposed manner from light. Accordingly, depending on a relative position of a gate edge of the opposing gate electrode film 102 with respect to the channel region 202 and the regions adjacent to the channel region 202 of the semiconductor film 201, the degree of shielding the end portions of the channel region 202 and the regions adjacent to the channel region 202 from light differs. Further, corresponding to an area within which the gate electrode film 102 and the semiconductor film 201 face each other in an opposed manner, a capacitance is increased or decreased. As described previously, when a region of the semiconductor film 201 where the concentration of impurity which becomes a carrier is high faces the gate electrode film 102 in an opposed manner, the capacitance is increased compared to a case where the region of the semiconductor film 201 at low impurity concentration faces the gate electrode film 102 in an opposed manner.

As described previously, the PAD portion 205b formed at the end of the semiconductor film 201 on the A side in the drawing is connected to the video signal line 104 via the contact hole 304f formed in the interlayer insulation film 304. In the same manner, the PAD portion 205a positioned at the end of the semiconductor film 201 on the C side in the drawing is connected to the electrode 320 via the contact hole 304g formed in the interlayer insulation film 304. Further, the electrode 320 is connected to the pixel electrode 107 which is positioned above the common electrode 108 and is electrically disconnected from the common electrode 108, via the contact hole 307g formed in the passivation insulation film 305, the leveling film 306 and the insulation film 307 positioned above the electrode 320.

FIG. 5 is an enlarged plan view showing the vicinity of the B in FIG. 3. FIG. 5 is a plan view showing the TFT 106 where, as described previously, the gate electrode film 102 is positioned below the semiconductor film 201 as viewed from above. The TFT 106 is explained in further detail in conjunction with FIG. 5.

As shown in FIG. 5, the semiconductor film 201 is formed into a strip shape having an equal strip width. The semiconductor film 201 is constituted of the high concentration regions 203, the first low concentration regions 204, the second low concentration regions 206 and the channel regions 202 which are defined corresponding to the degree of doping of impurity.

As shown in FIG. 2, the TFT 106 has the dual gate structure where two TFTs are connected in series. In FIG. 5, the channel regions 202 are indicated as a first channel region 202a and a second channel region 202b. In the semiconductor film 201 having the strip shape, the first channel region 202a and the second channel region 202b are provided in series by way of the high concentration region 203b and the like. Further, the first channel region 202a is connected to the pixel electrode 107 via the high concentration region 203a and the like, while the second channel region 202b is connected to the video signal line 104 via the high concentration region 203c and the like.

The first channel region 202a has a channel end 207a1 on an upper side in the drawing and a channel end 207a2 on a lower side in the drawing and, in the same manner, both ends of the second channel region 202b constitute a channel end 207b1 and a channel end 207b2.

The second low concentration regions 206a1, 206a2 are positioned on both sides of the first channel region 202a respectively. Further, the first low concentration regions 204a1, 204a2 are positioned on outer sides of both second low concentration regions 206a1, 206a2 respectively and are connected with the high concentration regions 203a, 203b respectively. In the same manner, the second low concentration regions 206b1, 206b2 are positioned on both sides of the second channel region 202b respectively. Further, the first low concentration regions 204b1, 204b2 are positioned on outer sides of both second low concentration regions 206b1, 206b2 respectively and are connected with the high concentration regions 203c, 203b respectively. A boundary line between the second low concentration region 206a1 and the first low concentration region 204a1 and a boundary line between the second low concentration region 206a2 and the first low concentration region 204a2 are respectively set as boundary lines 208a1, 208a2. A boundary line between the first low concentration region 204a1 and the high concentration region 203a and a boundary line between the first low concentration region 204a2 and the high concentration region 203b are respectively set as boundary lines 209a1, 209a2. In the same manner, a boundary line between the second low concentration region 206b1 and the first low concentration region 204b1 and a boundary line between the second low concentration region 206b2 and the first low concentration region 204b2 are respectively set as boundary lines 208b1, 208b2. A boundary line between the first low concentration region 204b1 and the high concentration region 203c and a boundary line between the first low concentration region 204b2 and the high concentration region 203b are respectively set as boundary lines 209b1, 209b2.

Further, the first channel region 202a and the second channel region 202b shown in FIG. 5 have an equal channel length. That is, a distance between the channel end 207a1 and the channel end 207a2 which constitute both ends of the first channel region 202a and a distance between the channel end 207b1 and the channel end 207b2 which constitute both ends of the second channel region 202b are equal. Further, the second low concentration regions 206 which abut on both sides of the channel region 202 have an equal region length. Further, the first low concentration regions 204 which abut on outer sides of the second low concentration regions 206 also have a same region length. That is, a distance between the channel end 207a1 and the boundary line 208a1, a distance between the channel end 207a2 and the boundary line 208a2, a distance between the channel end 207b1 and the boundary line 208b1 and a distance between the channel end 207b2 and the boundary line 208b2 are all equal. In the same manner, a distance between the boundary line 208a1 and the boundary line 209a1, a distance between the boundary line 208a2 and the boundary line 209a2, a distance between the boundary line 208b1 and the boundary line 209b1, and a distance between the boundary line 208b2 and the boundary line 209b2 are all equal.

Next, the gate electrode film 102 is explained. In FIG. 5, the gate electrode film 102 is formed into a strip shape having an equal strip width, and faces the semiconductor film 201 in an opposed manner. The gate electrode film 102 has a gate edge 102a1 on an upper side in the drawing, and a gate edge 102a2 on a lower side in the drawing. Regions of the gate electrode film 102 which face the semiconductor film 201 in an opposed manner are assumed as gate regions. That is, in viewing the semiconductor film 201 from above, the gate regions are regions of the gate electrode film 102 which overlap with the semiconductor film 201 positioned above the gate electrode film 102. Further, out of the gate regions, the region which extends in the vicinity of the first channel region 202a and the region which extends in the vicinity of the second channel region 202b are respectively assumed as a first gate region and a second gate region.

When the semiconductor film 201 is viewed from above, the gate edge 102a1 of the gate electrode film 102 overlaps with the boundary lines 208a1, 208b1 on the semiconductor film 201, and the gate edge 102*a*2 of the gate electrode film 102 overlaps with the boundary lines 208*a*2, 208*b*2 on the semiconductor film 201.

Accordingly, the first gate region is a region of the gate electrode film 102 where the gate electrode film 102 overlaps with the first channel region 202*a* and the second low concentration regions 206*a*1, 206*a*2 abutting on the first channel region 202*a* which are arranged above the gate electrode film 102. In FIG. 3 and FIG. 5, the first channel region 202*a* and the second low concentration regions 206*a*1, 206*a*2 abutting on the first channel region 202*a* overlap the first gate region from above and hence, the first gate region is not shown in the drawing.

That is, with respect to the semiconductor film 201, in the vicinity of the first channel region 202*a*, the first channel region 202*a* and the second low concentration regions 206*a*1, 206*a*2 which are positioned on both sides of the first channel region 202*a* are shielded from light by the gate electrode film 102. However, the first low concentration regions 204*a*1, 204*a*2 which are positioned on outer sides of the second low concentration regions 206*a*1, 206*a*2 are not shielded from light by the gate electrode film 102. The same goes for the vicinity of the second channel region 202*b*.

Figure 12:
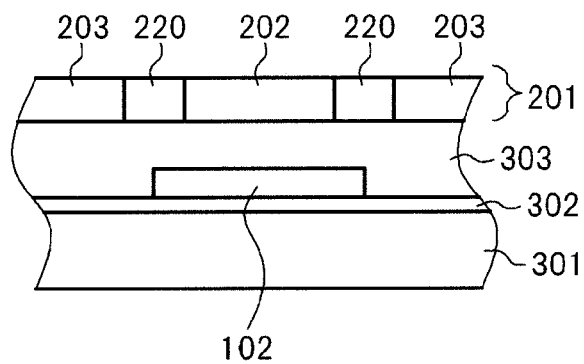
FIG. 12 is a view showing one example of the LDD structure of a TFT according to a related art.
Figure 13:
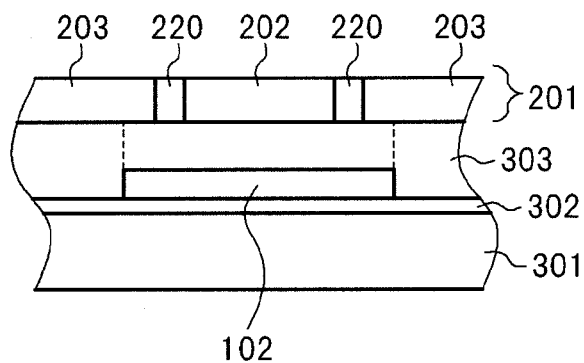
FIG. 13 is a view showing another example of the LDD structure of a TFT according to a related art.

The region of the semiconductor film 201 which faces the first gate region in an opposed manner is constituted of the first channel region 202*a* and the second low concentration regions 206*a*1, 206*a*2 which are positioned on both sides of the first channel region 202*a*. Further, the first low concentration regions 204*a*1, 204*a*2 which are positioned further outside the second low concentration regions 206*a*1, 206*a*2 do not face the first gate region in an opposed manner thus providing the structure which suppresses the increase of parasitic capacitance. This structure is similar to the LDD structure shown in FIG. 12. However, assuming that impurity concentration of the low concentration region 220 in FIG. 12 is approximately equal to the impurity concentration of the first low concentration region 204 shown in FIG. 5, compared to the LDD structure relating to the related art shown in FIG. 12, the low concentration region which faces the first gate region in an opposed manner is constituted of the second low concentration regions 206*a*1, 206*a*2 whose impurity concentration is lower than the first low concentration region 204, as shown in FIG. 5, and hence, the parasitic capacitance can be further reduced.

On the other hand, the first low concentration regions 204*a*1, 204*a*2 are not shielded from light by the first gate region thus providing the structure which allows the generation of hole electron pairs which may become a cause of a light leakage current in the first low concentration regions 204*a*1, 204*a*2. However, for example, when a potential difference is generated between the first channel region 202*a* and the high concentration region 203*a* at the time of turning off a gate voltage in the vicinity of the channel end 207*a*1 of the first channel region 202*a*, a potential of the first low concentration region 204*a*1 and a potential of the second low concentration region 206*a*1 are arranged in order between a potential of the high concentration region 203*a* and a potential of the first channel region 202*a*. Accordingly, an electric field generated between the high concentration region 203*a* and the first channel region 202*a* at the time of turning off the gate voltage is further decreased compared to a case shown in FIG. 12. Accordingly, compared to the LDD structure relating to the related art shown in FIG. 12, the movement of holes or electrons can be further suppressed thus suppressing a light leakage current more effectively.

Further, the second low concentration region 206*a*1 whose impurity concentration is even lower than impurity concentration of the first low concentration region 204*a*1 is positioned abutting on the first channel region 202*a* and hence, an electric field generated in the vicinity of the channel end 207*a*1 of the first channel region 202*a* is further decreased thus enhancing source/drain withstand property.

Although the first channel region 202*a* and the regions in the vicinity of the first channel region 202*a* have been explained heretofore, it is needless to say that the same advantageous effect can be obtained in the second channel region 202*b* and the regions in the vicinity of the second channel region 202*b*. Further, as shown in FIG. 5, by adopting the dual gate structure where two TFTs having the above-mentioned structure are arranged in series, a light leakage current suppressing effect can be further enhanced.

Next, a method of manufacturing the TFT substrate 2 according to this embodiment is explained in conjunction with FIG. 6A to FIG. 6J. Here, a case where the TFT is an nMOS polycrystalline silicon TFT having the bottom gate structure is exemplified.

Figure 6A:
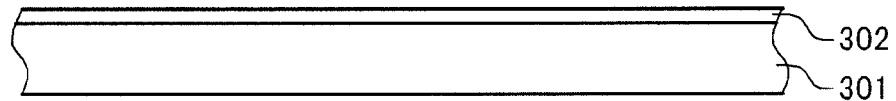
FIG. 6A is a view showing a process of manufacturing the TFT substrate of the display device according to a first embodiment of the invention.

Firstly, a contamination prevention film 302 for preventing the contamination by impurity from the transparent substrate 301 is laminated to the transparent substrate 301. The transparent substrate 301 is formed of a glass substrate, for example. The contamination prevention film 302 is a silicon nitride ($SiN_x$) film formed by a CVD method, for example (FIG. 6A).

Figure 6B:
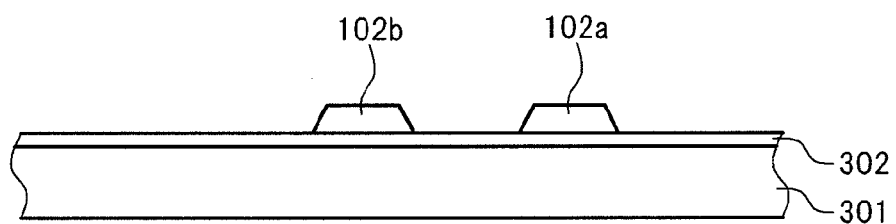
FIG. 6B is a view showing a process of manufacturing the TFT substrate of the display device according to the first embodiment of the invention.

Next, the gate electrode film 102 is formed. Since the gate electrode film 102 is heated at a high temperature in a Si crystallizing process performed later, it is desirable to form the gate electrode film 102 using a conductive material having a relatively high melting point such as Mo, W, Ti, Ta or an alloy of these materials. The gate electrode film 102 is formed into a desired shape by way of a known lithography process and a known etching process (FIG. 6B). In FIG. 6B, the gate electrode film 102 is indicated as the gate electrode films 102*a*, 102*b*. The gate electrode films 102*a*, 102*b* are formed so as to have a film thickness sufficient for the acquisition of the concentration difference at low concentration regions described later.

Figure 6C:
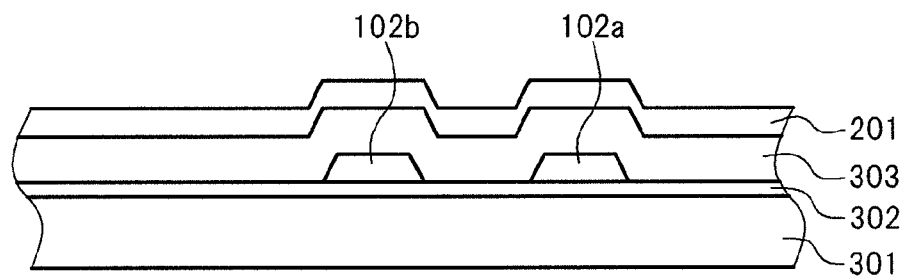
FIG. 6C is a view showing a process of manufacturing the TFT substrate of the display device according to the first embodiment of the invention.

The gate insulation film 303 is formed so as to cover the gate electrode film 102, and the semiconductor film 201 is formed on the gate insulation film 303. The gate insulation film 303 is a silicon oxide ($SiO_x$) film or a silicon nitride ($SiN_x$) film, for example, and is formed by a CVD method or the like. The semiconductor film 201 is formed such that firstly an amorphous silicon film is formed by a CVD method, dehydration processing or the like is applied to the amorphous silicon film and, thereafter, the amorphous silicon film is formed into a polycrystalline silicon film by crystallization by laser annealing or the like using an excimer laser or the like (FIG. 6C).

As described previously, the gate electrode films 102*a*, 102*b* have the sufficient film thickness and hence, the semiconductor film 201 has an uneven surface such that the surface of the semiconductor film 201 is raised above the gate electrode films 102*a*, 102*b*.

Figure 6D:
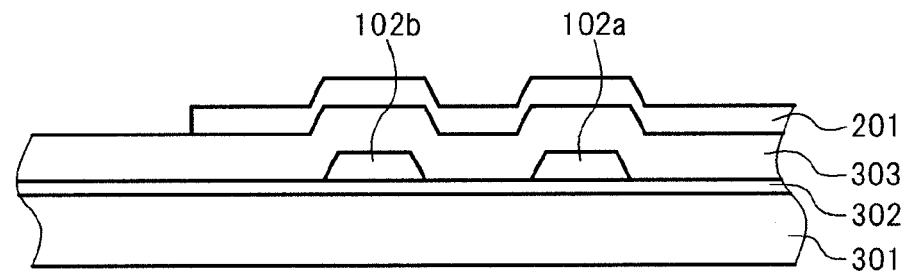
FIG. 6D is a view showing a process of manufacturing the TFT substrate of the display device according to the first embodiment of the invention.

The semiconductor film 201 is formed into a shape or the like shown in FIG. 3 by way of a known lithography process and a known etching process (FIG. 6D).

Next, a leveled insulation film 304*a* is formed so as to cover the semiconductor film 201. The insulation film 304*a* is formed of a leveled silicon oxide ($SiO_x$) film by coating, for example. Since impurity is implanted into the semiconductor film 201 through the insulation film 304*a*, it is desirable to set a film thickness of the insulation film 304*a* to not more than 200 nm. Then, impurity is implanted into the semiconductor film 201 for controlling a threshold voltage of the TFT (FIG.

Figure 6E:
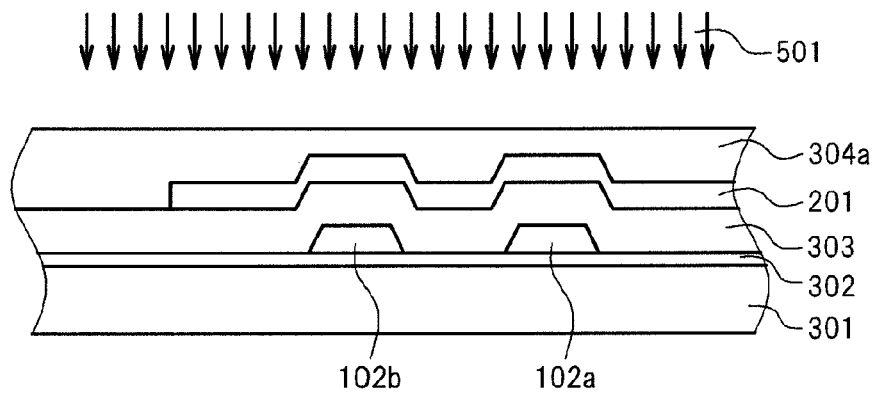
FIG. 6E is a view showing a process of manufacturing the TFT substrate of the display device according to the first embodiment of the invention.

6E). The impurity is phosphorous (P), boron (B) or the like, for example. A plurality of arrows 501 shown in an upper portion of FIG. 6E schematically express a mode where the impurity is implanted into the semiconductor film 201.

Figure 6F:
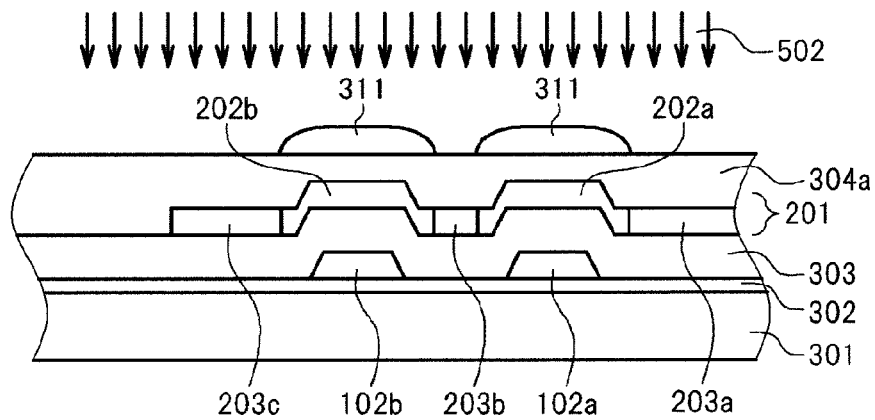
FIG. 6F is a view showing a process of manufacturing the TFT substrate of the display device according to the first embodiment of the invention.

A photo resist is applied to the above-mentioned insulation films 304a by coating, exposure process and development process are applied to the coated photo resist and, thereafter, unnecessary photo resist is removed. Due to such processing, a pattern is formed such that a photo resist 311 remains in the channel region 202 which faces the gate electrode film 102 in an opposed manner and at predetermined positions in the vicinity of the channel region 202. The high concentration region 203 is formed by implanting impurity of typically not less than $1 \times 10^{19}$ atom/cm$^3$ into the semiconductor film 201 (FIG. 6F). The impurity is phosphorous (P) or the like, for example. A plurality of arrows 502 shown in an upper portion of FIG. 6F express a mode in which impurity is implanted into the semiconductor film 201 in the same manner as FIG. 6E.

Figure 6G:
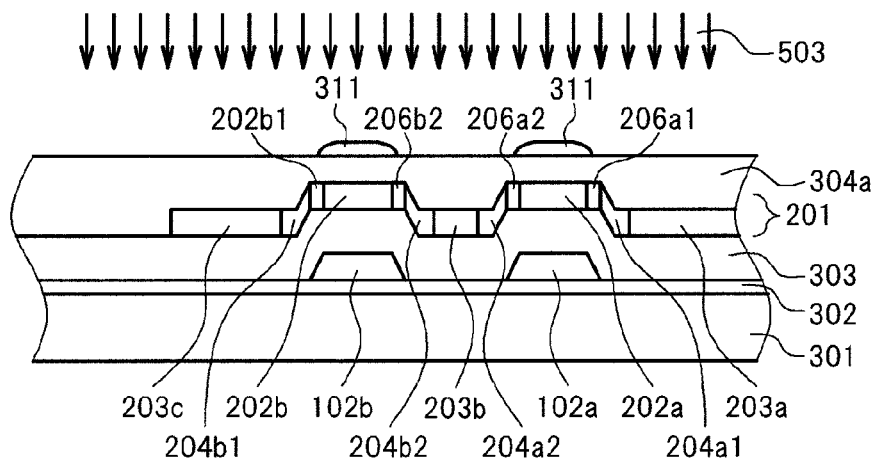
FIG. 6G is a view showing a process of manufacturing the TFT substrate of the display device according to the first embodiment of the invention.

The photo resist 311 is retracted by applying ashing process or reflow process such as heat treatment to the photo resist 311. Alternatively, the photo resist 311 is removed and, thereafter, a new pattern formed of the photo resist 311 may be formed again using the above-mentioned method. Then, by implanting impurity into the semiconductor film 201, due to the unevenness of the surface of the semiconductor film 201, the first low concentration regions 204 and the second low concentration regions 206 are formed, wherein the first low concentration regions 204 are doped with impurity of concentration lower than the impurity concentration of the high concentration region 203 and the second low concentration regions 206 are doped with impurity of concentration even lower than the impurity concentration of the first low concentration region 204 (FIG. 6G). In a typical case, a film thickness of the gate electrode film 102 and a film thickness of the insulation film 304a may be adjusted such that impurity of $1 \times 10^{18}$ to $1 \times 10^{19}$ atom/cm$^3$ is implanted into the first low concentration region 204 and, at the same time, the impurity concentration of the second low concentration region 206 becomes not more than 50% of the impurity concentration of the first low concentration region 204. Alternatively, the film thickness of the gate electrode film 102 and the film thickness of the insulation film 304a may be adjusted such that impurity of $5 \times 10^{17}$ to $5 \times 10^{18}$ atom/cm$^3$ is implanted into the second low concentration region 206 positioned above the gate electrode film 102, and impurity of $1 \times 10^{18}$ to $1 \times 10^{19}$ atom/cm$^3$ is implanted into the first low concentration region 204 positioned outside the second low concentration region 206. Here, the impurity is phosphorous (P) or the like, for example. In general, impurity implanted into the low concentration regions 206, 204 is equal to impurity implanted into the high concentration region 203. However, a substance which differs from the impurity implanted into the high concentration region 203 may be used as impurity implanted into the low concentration regions 206, 204. Thereafter, the photo resist 311 is removed by ashing process. A plurality of arrows 503 shown in an upper portion of FIG. 6G also express a mode in which the impurity is implanted into the same manner as FIG. 6E and FIG. 6F.

By adjusting a pattern shape of the above-mentioned photo resist 311 or a retraction length of the photo resist 311 in the above-mentioned reflow process, the channel regions 202, the second low concentration regions 206, the first low concentration regions 204 and the high concentration regions 203 of each TFT shown in FIG. 3 and FIG. 5 are formed.

Figure 6H:
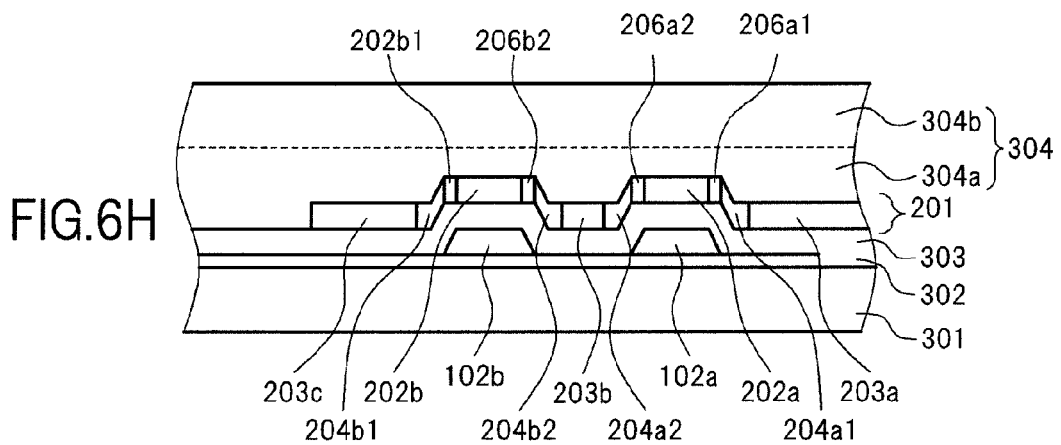
FIG. 6H is a view showing a process of manufacturing the TFT substrate of the display device according to the first embodiment of the invention.

The interlayer insulation film 304 is formed by further laminating the insulation film 304b onto the insulation film 304a. The interlayer insulation film 304 is provided for suppressing capacitances which are formed between the gate electrode film 102 and the video signal line 104, the electrode 320, circuit wiring and the like. Thereafter, annealing is performed for activating impurity contained in the high concentration regions 203, the first low concentration regions 204 and the second low concentration regions 206 or for repairing crystal defects generated by the implantation of impurity (FIG. 6H).

Figure 6I:
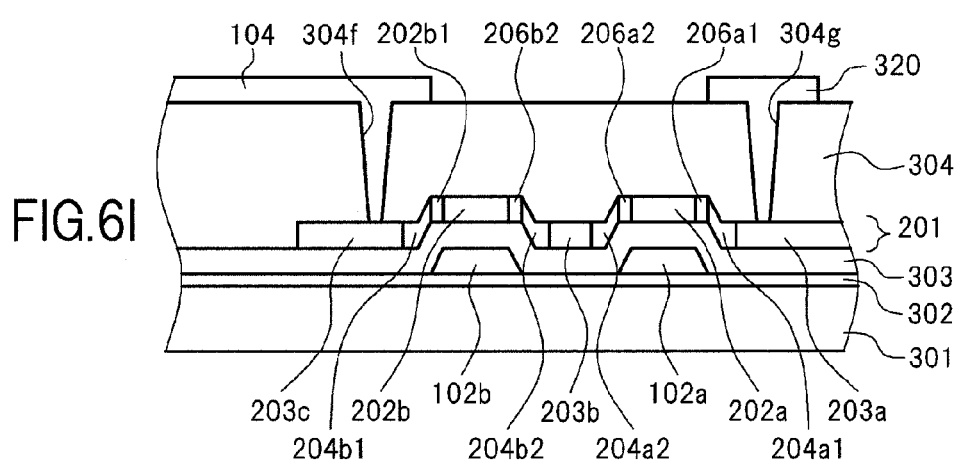
FIG. 6I is a view showing a process of manufacturing the TFT substrate of the display device according to the first embodiment of the invention.

Further, the contact holes 304f, 304g are formed by a known lithography process and a known etching process (FIG. 6I).

Figure 6J:
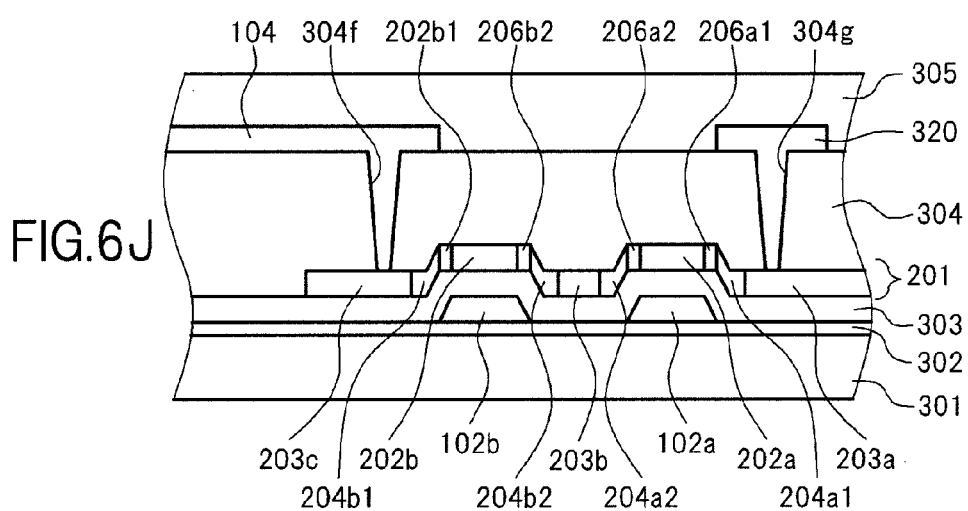
FIG. 6J is a view showing a process of manufacturing the TFT substrate of the display device according to the first embodiment of the invention.

The electrode 320 which is provided for connection between the semiconductor film 201 and the pixel electrode 107 via the contact hole 304g, and the video signal line 104 which is provided for connection with the semiconductor film 201 via the contact hole 304f, are formed. The passivation film 305 is formed so as to cover the electrode 320, the video signal line 104 and the interlayer insulation film 304. As the passivation film 305, a silicon nitride (SiNx) film is formed by a CVD method, for example. Thereafter, annealing is performed so as to bond hydrogen to a dangling bond present in the semiconductor film 201, on an interface between the semiconductor film 201 and the gate insulation film 303 or the like (FIG. 6J).

As shown in FIG. 4, thereafter, the leveling film 306 and the common electrode 108 is formed. Next, the insulation film 307 is formed and the contact hole 307g is formed by a known lithography process and a known etching process. Thereafter, the pixel electrode 107 is formed thus constituting an IPS pixel region.

The manufacturing method of the TFT substrate 2 has been explained heretofore. The technical feature of the manufacturing method lies in that by making use of the presence of the uneven surface of the semiconductor film 201, the first low concentration regions 204 and the second low concentration regions 206 are formed by performing implantation of impurity one time, so that the number of processes can be decreased.

The channel regions 202, the second low concentration regions 206, the first low concentration regions 204 and the high concentration regions 203 have been explained heretofore. However, there may be a case where it is difficult to strictly define boundary positions. This is because, in the actual implantation of impurity, the impurity concentration is continuously changed in a region boundary and hence, a boundary between the regions is not a line in a strict sense and has a certain finite width. Further, in this manufacturing method, the boundary between the second low concentration region 206 and the first low concentration region 204 is formed by making use of the uneven surface of the semiconductor film 201 and hence, the impurity concentration is changed more continuously. Accordingly, the position of the boundary is defined based on a position of an outer frame of the region of the photo resist 311 or a position of the gate electrode film 102. That is, the boundary between the channel region 202 and the second low concentration region 206 is defined based on the position of the regional outer frame of the photo resist 311 shown in FIG. 6G. The boundary between the second low concentration region 206 and the first low concentration region 204 is defined based on a position of an upper gate edge of the gate electrode film 102. The boundary between the first low concentration region 204 and the high concentration region 203 is defined by a position of an outer frame of the region of the photo resist 311 shown in FIG. 6F.

Further, the TFT substrate 2 according to this embodiment is explained with respect to the case which adopts the dual gate structure where two TFTs are arranged in series. However, it is needless to say that the invention is applicable to a case which adopts the single gate structure where one TFT is provided or a case which adopts the multiple gate structure where three or more TFTs are arranged in series.

Second Embodiment

A display device according to the second embodiment of the invention is a kind of IPS liquid crystal display device. The basic constitution of this display device is equal to the basic constitution of the display device according to the first embodiment. The display device according to this embodiment differs from the display device according to the first embodiment with respect to a relative position between the semiconductor film 201 and the gate electrode film 102 which faces the semiconductor film 201 in an opposed manner on the TFT substrate 2.

The invention is not limited to the case shown in FIG. 5 where the gate edge 102a1 of the gate electrode film 102 overlaps with the boundary line between the second low concentration region 206 and the first low concentration region 204 in the semiconductor film 201 as viewed from above.

FIG. 7 is an enlarged plan view showing the relative position between the semiconductor film 201 and the gate electrode film on the TFT substrate 2 according to this embodiment. FIG. 7 shows the invention-applicable typical examples of the relative position of the gate edge 102j of the gate electrode film 102 positioned below the semiconductor film 201 in an opposed manner with respect to the semiconductor film 201 on one side of one TFT.

In FIG. 7(d), correspondingly to the case shown in FIG. 5, the gate edge 102j of the gate electrode film 102 overlaps with a boundary line 222j between the second low concentration region 206 and the first low concentration region 204 of the semiconductor film 201.

Figure 8A:
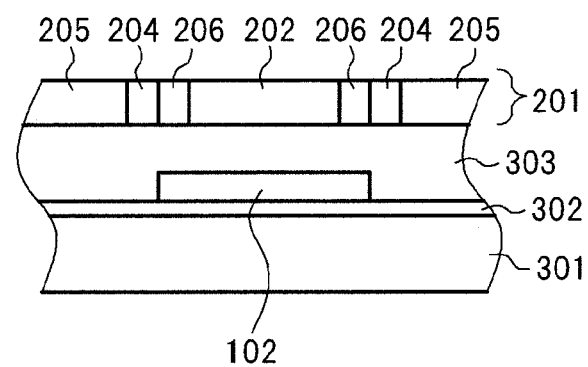
FIG. 8A is a schematic view showing one example of a TFT according to the second embodiment of the invention.

FIG. 8A is a schematic view showing one example of the TFT according to this embodiment. The TFT shown in FIG. 8A is configured such that the structure shown in FIG. 7(d) is adopted on both sides of the TFT, wherein either one of two TFTs shown in FIG. 4 is simplified.

In FIG. 7(e), the gate edge 102j of the gate electrode film 102 overlaps with the inside of the second low concentration region 206 of the semiconductor film 201. This case provides the structure which can suppress the increase of parasitic capacitance more effectively compared to the case shown in FIG. 7(d). On the other hand, neither the first low concentration region 204 nor a portion of the second low concentration region 206 is shielded from light by the gate electrode film 102 and hence, more hole electron pairs are generated. However, since the second low concentration region 206 and the first low concentration region 204 are positioned between the channel region 202 and the high concentration region 203, for example, it is possible to suppress a light leakage current more effectively compared to the LDD structure according to the related art shown in FIG. 12.

In FIG. 7(c), the gate edge 102j of the gate electrode film 102 overlaps with the inside of the first low concentration region 204 of the semiconductor film 201. In this case, in addition to the second low concentration region 206, a portion of the first low concentration region 204 is also shielded from light by the gate electrode film 102 thus providing the structure which can suppress a light leakage current more effectively compared to the case shown in FIG. 7(d). On the other hand, compared to the case shown in FIG. 7(d), parasitic capacitance is increased. However, a region of the semiconductor film 201 which faces the gate electrode film 102 includes the second low concentration region 206 doped with impurity of concentration lower than concentration of impurity contained in the first low concentration region 204 and hence, the increase of the parasitic capacitance can be suppressed compared to a case where the whole second low concentration region 206 exhibits the impurity concentration substantially equal to the impurity concentration of the first low concentration region 204.

Figure 8B:
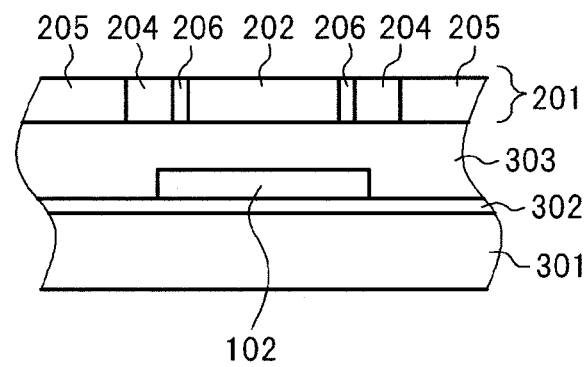
FIG. 8B is a schematic view showing one example of the TFT according to the second embodiment of the invention.

FIG. 8B is a schematic view showing one example of the TFT according to this embodiment. The TFT shown in FIG. 8B adopts the structure shown in FIG. 7(c) on both sides thereof.

In FIG. 7(b), the gate edge 102j of the gate electrode film 102 overlaps with a boundary line 223j between the first low concentration region 204 and the high concentration region 203 in the semiconductor film 201. In this case, the first low concentration region 204 is also shielded from light by the gate electrode film 102 thus providing the structure which can suppress a light leakage current more effectively compared to the case shown in FIG. 7(d). On the other hand, in the same manner as FIG. 7(c), the increase of the parasitic capacitance can be suppressed compared to a case where the whole second low concentration region 206 exhibits substantially the same impurity concentration as the first low concentration region 204.

In FIG. 7(a), the gate edge 102j of the gate electrode film 102 overlaps with the inside of the high concentration region 203 of the semiconductor film 201. In this case, the first low concentration region 204 is also sufficiently shielded from light by the gate electrode film 102 thus providing the structure which can suppress a light leakage current more effectively compared to the case shown in FIG. 7(d). On the other hand, in the same manner as FIG. 7(c), the increase of the parasitic capacitance can be suppressed compared to a case where the whole second low concentration region 206 exhibits the impurity concentration substantially equal to the impurity concentration of the first low concentration region 204.

In this manner, by changing the relative position between the gate electrode film 102 and the semiconductor film 201, it is possible to provide the structure which assigns the priority to the suppression of the light leakage current and the structure which assign the priority to the suppression of the increase of the parasitic capacitance and hence, the structure which is suitable for the TFT can be selected depending on the necessity. FIG. 8A and FIG. 8B show the case where the same structure is adopted on both sides of the TFT. However, different structures may be adopted on both sides of the TFT. Any one of the structures shown in FIG. 7 may be selected depending on necessity.

When any one of the structures shown in FIG. 7 is adopted on one side of the TFT, on the other side of the TFT, the usual LDD structure may be adopted or the structure which includes no low concentration regions may be adopted.

It has been known that, in the multiple gate structure where a plurality of TFTs are arranged in series, at the time of turning off a gate voltage, a light leakage current is liable to be generated when hole electron pairs are generated in the vicinity of channel end positioned closest to a video signal line 104 side or a pixel electrode 107 side among both ends of the channel regions of the plurality of TFTs. Accordingly, it is desirable that the structure which assigns priority to the suppression of a light leakage current shown in FIG. 7(c) or the like, for example, is adopted only in the vicinity of the channel ends, and the structure which assigns priority to the suppression of the increase of parasitic capacitance shown in FIG. 7(e) or the like, for example, is adopted in the vicinity of the other channel ends.

Next, a method of manufacturing the TFT substrate 2 according to this embodiment is explained in conjunction with FIG. 9A to FIG. 9D. Here, a case where the TFT has the structure shown in FIG. 8B and is an nMOS polycrystalline silicon TFT having the bottom gate structure in the same manner as the first embodiment is exemplified.

Figure 9A:
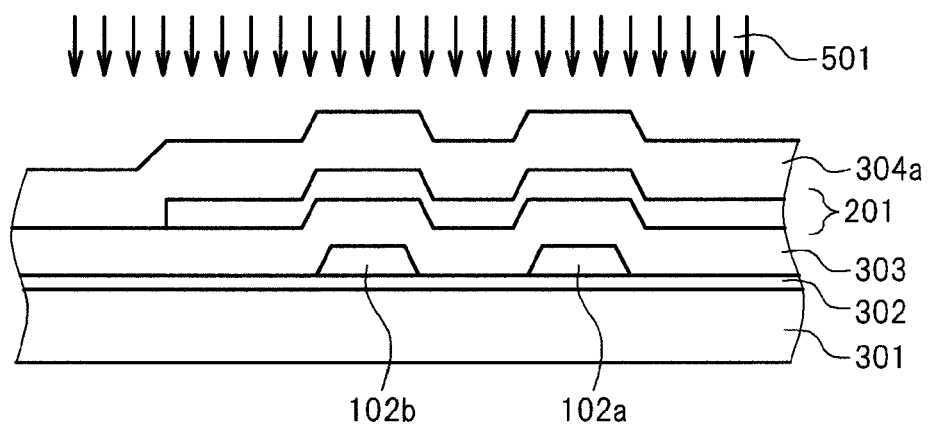
FIG. 9A is a view showing a process of manufacturing the TFT substrate of the display device according to the second embodiment of the invention.

In the same manner as the manufacturing method of the TFT substrate 2 according to the first embodiment, as shown in FIG. 6A to FIG. 6D, the semiconductor film 201 is formed over the transparent substrate 301, and the semiconductor film 201 is formed into a shape shown in FIG. 3. Although the leveled insulation film 304a is formed of the coated silicon oxide ($SiO_x$) film in the TFT substrate 2 according to the first embodiment, a silicon oxide ($SiO_x$) film is formed by a CVD method in the TFT substrate 2 according to the this embodiment (FIG. 9A). Accordingly, as shown in FIG. 9A, a surface of the insulation film 304a also becomes uneven due to thin film layers positioned below the insulation film 304a.

Since impurity is implanted into the semiconductor film 201 through the insulation film 304a, it is desirable to set a film thickness of the insulation film 304a to not more than 200 nm. Then, impurity is implanted into the semiconductor film 201 for controlling a threshold voltage of the TFT (FIG. 9A). The impurity is phosphorous (P), boron (B) or the like, for example. A plurality of arrows 501 shown in an upper portion of FIG. 9A schematically express a mode where the impurity is implanted into the semiconductor film 201.

Figure 9B:
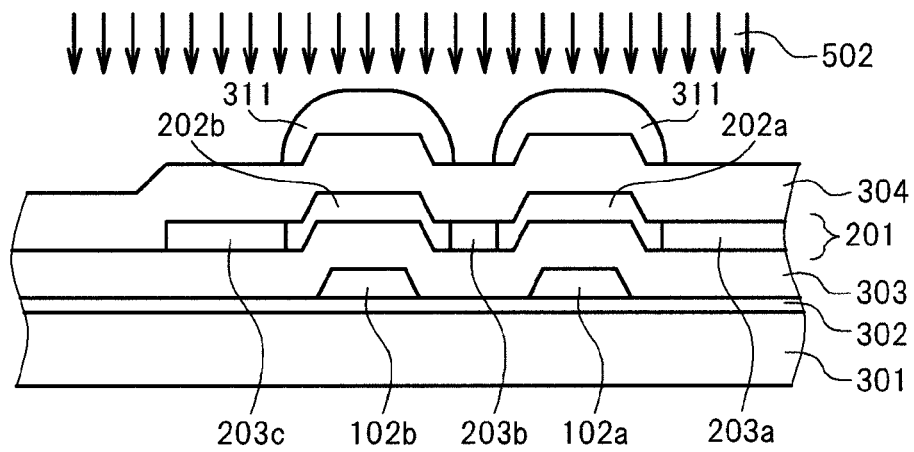
FIG. 9B is a view showing a process of manufacturing the TFT substrate of the display device according to the second embodiment of the invention.

A photo resist is applied to the above-mentioned insulation film 304a by coating, exposure process and development process are applied to the coated photo resist and, thereafter, unnecessary photo resist is removed. Due to such processing, a pattern is formed such that a photo resist 311 remains in the channel region 202 which faces the gate electrode film 102 in an opposed manner and at predetermined positions in the vicinity of the channel region 202. The high concentration region 203 is formed by implanting impurity of typically not less than $1 \times 10^{19}$ atom/$cm^3$ into the semiconductor film 201 (FIG. 9B). The impurity is phosphorous (P) or the like, for example. A plurality of arrows 502 shown in an upper portion of FIG. 9B express a mode in which impurity is implanted into the semiconductor film 201 in the same manner as FIG. 9A.

The photo resist 311 is removed and, thereafter, a new pattern formed of the photo resist 311 is formed again using the above-mentioned method. By implanting impurity into the semiconductor film 201, the first low concentration regions 204 doped with impurity of concentration lower than the impurity concentration of the high concentration region 203 are formed (FIG. 9C). An implantation quantity of impurity may be adjusted such that impurity of $1 \times 10^{18}$ to $1 \times 10^{19}$ atom/$cm^3$ is typically implanted into the first low concentration region 204 at the time of completion of the TFT by taking the implantation of impurity for the formation of the second low concentration region 206 described later into consideration. A plurality of arrows 504 shown in an upper portion of FIG. 9C also express a mode in which the impurity is implanted in the same manner as FIG. 9A and FIG. 9B.

The photo resist 311 is removed and, thereafter, a new pattern formed of the photo resist 311 is formed again using the above-mentioned method. Then, by implanting impurity into the semiconductor film 201 such that the impurity concentration is typically set to not more than 50% of the impurity concentration of the first low concentration region 204, or by implanting impurity of $5 \times 10^{17}$ to $5 \times 10^{18}$ atom/$cm^3$ into the semiconductor film 201, the second low concentration regions 206 doped with impurity of concentration even lower than the impurity concentration of the first low concentration region 204 are formed (FIG. 9D). Here, the impurity is phosphorous (P) or the like, for example. In general, impurity implanted into the low concentration regions 206, 204 is equal to impurity implanted into the high concentration region 203. However, a substance which differs from the impurity implanted into the high concentration region 203 may be used as impurity implanted into the low concentration regions 206, 204. Thereafter, the photo resist 311 is removed by ashing process. A plurality of arrows 505 shown in an upper portion of FIG. 9D also express a mode in which the impurity is implanted in the same manner as FIG. 9A, FIG. 9B and FIG. 9C.

Correspondingly to pattern shapes of the respective photo resists 311, the channel regions 202, the second low concentration regions 206, the first low concentration regions 204 and the high concentration regions 203 of each TFT are formed.

Succeeding processes are substantially equal to the corresponding processes of the manufacturing method of the TFT substrate 2 according to the first embodiment. The manufacturing method of this embodiment is, differently from the manufacturing method of the TFT substrate 2 according to the first embodiment, characterized in that a position of the boundary between the second low concentration region 206 and the first low concentration region 204 can be freely designed and formed. Further, it is needless to say that the TFT substrate 2 according to the first embodiment can be manufactured using the manufacturing method of this embodiment. From these two manufacturing methods of the TFT substrate 2, the selection of the manufacturing method may be made as necessary.

As has been explained in conjunction with first embodiment, there may be a case where it is difficult to strictly define boundary positions with respect to the channel regions 202, the second low concentration regions 206, the first low concentration regions 204 and the high concentration regions 203. With respect to these concentration regions, in the same manner as described above, the position of the boundary is defined based on a position of an outer frame of the region of the photo resist 311 shown in FIG. 9B to FIG. 9D.

Third Embodiment

A display device according to the third embodiment of the invention is a kind of IPS liquid crystal display device. The basic constitution of this display device is equal to the basic constitution of the display device according to the first embodiment. The display device according to this embodiment differs from the display device according to the first embodiment with respect to the structure of the TFT substrate 2. The display device according to the third embodiment is characterized by applying the technique described in patent document 2 to the invention.

Figure 10:
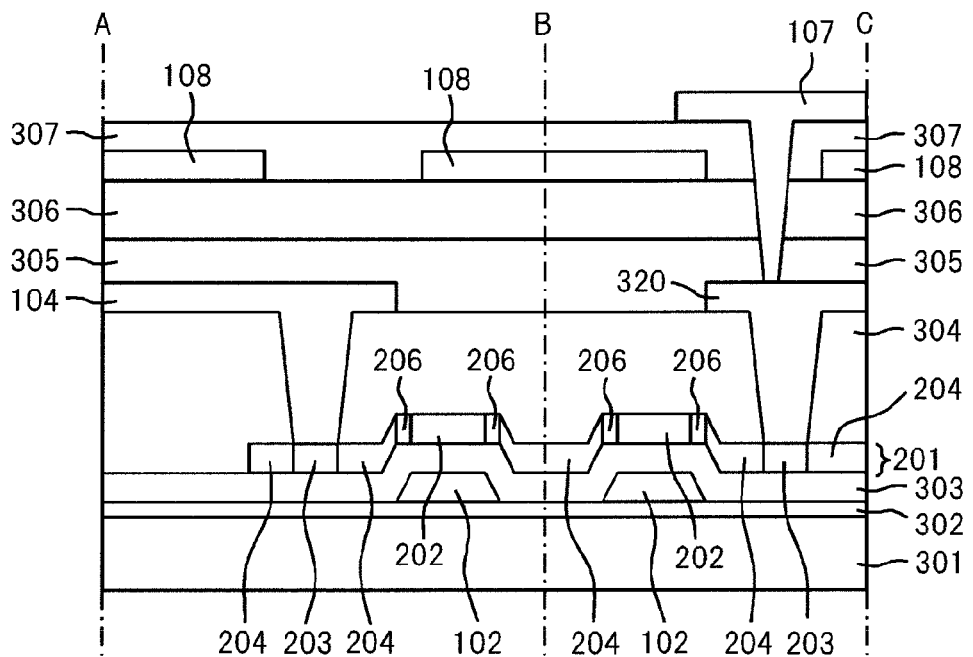
FIG. 10 is a cross-sectional view of a TFT substrate according to a third embodiment of the invention.

FIG. 10 is a cross-sectional view of the TFT substrate 2 according to the third embodiment of the invention. Differently form the TFT substrate 2 of the first embodiment shown in FIG. 3, portions of a semiconductor film 201 which are connected with a video signal line 104 and an electrode 320 via contact holes are formed as high concentration regions 203. It is possible to decrease the number of processes by implanting impurity by making use of the contact holes.

The embodiments of the inventions have been explained heretofore. In such explanation of the embodiments, the explanation is made with respect to the case where, in the semiconductor film 201, the low concentration region which is positioned between the channel region 202 and the high concentration region 203 is formed of the first low concentration region 204 and the second low concentration region 206. However, the low concentration region may be formed of three or more regions which have different impurity concentrations. Further, as described previously, in the actual structure, the concentration in the low concentration region is continuously changed with respect to the position rather than being discontinuously changed with respect to the position. Even in such a case, it is sufficient that a portion of the low concentration region includes the first low concentration region 204 and the second low concentration region 206. Further, although the explanation has been made by taking the n-type TFT where the carrier is constituted of electrons due to impurity as an example, the invention is also applicable to a p-type TFT where a carrier is constituted of holes.

Further, for example, as shown in FIG. 6A to FIG. 6J, the unevenness of the surface of the semiconductor film 201, the presence of the inclination on both edges of the gate electrode film 102 and the like are described in an exaggerating manner so as to facilitate the understanding of the structure and the manufacturing method of the TFT. On the other hand, when it is unnecessary to describe the structure in an exaggerating manner as in the case shown in FIG. 8A, FIG. 8B, the structure is described in a simplified manner such that the surface of the semiconductor film 201 is leveled or both edges of the gate electrode film 102 are formed perpendicularly.

Figure 11:
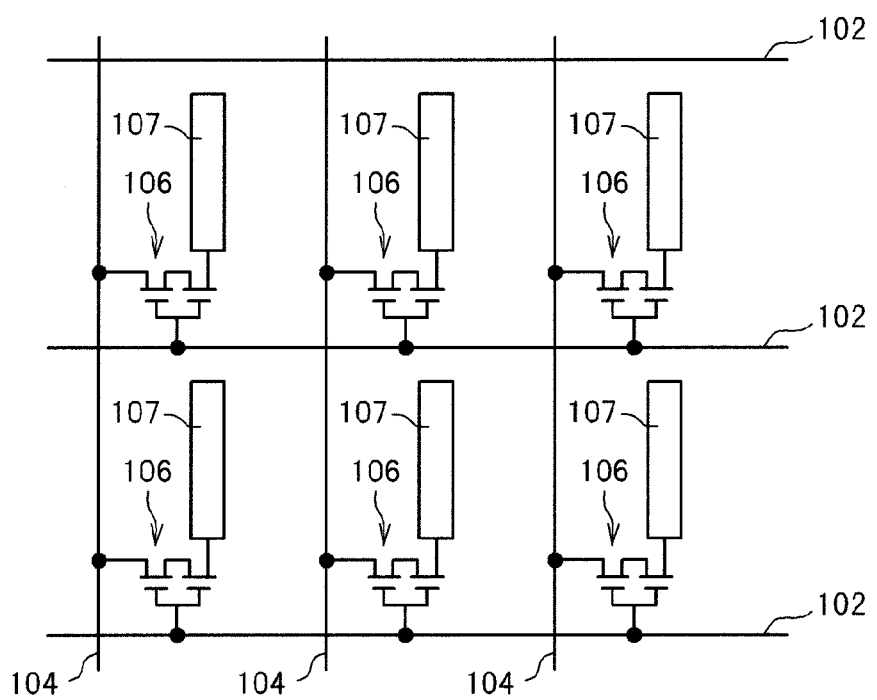
FIG. 11 is a diagram showing an equivalent circuit of a TFT substrate of a liquid crystal display device according to another example of an embodiment of the invention.

The explanation has been made heretofore with respect to the case where the IPS liquid crystal display device is used as the display device according to the embodiments of the invention. According to the invention, however, the display device may be an other-type IPS liquid crystal display device or a liquid crystal display device which adopts another drive method such as a VA (Vertically Aligned) liquid crystal display device or a TN (Twisted Nematic) liquid crystal display device or may be other display devices. FIG. 11 is an equivalent circuit diagram of a TFT substrate 2 of a liquid crystal display device according to another example of the embodiment of the invention. FIG. 11 shows a case where a VA liquid crystal display device or a TN liquid crystal display device is used as the display device. When the display device is the VA liquid crystal display device or the TN liquid crystal display device, a common electrode 108 (not shown in the drawing) is formed on the filter substrate 1 which faces the TFT substrate 2 in an opposed manner.

While there have been described what are at present considered to be certain embodiments of the invention, it will be understood that various modifications may be made thereto, and it is intended that the appended claims cover all such modifications as fall within the true spirit and scope of the invention.

What is claimed is:

1. A display device comprising:
a semiconductor film which is arranged between a video signal line and a pixel electrode and which is provided with one or more channel regions and with one or more impurity doped regions which are doped with a first impurity;
a light source which is arranged below the semiconductor film and which generates light; and
one or more gate electrodes which are arranged below the semiconductor film and above the light source, and face the one or more channel regions in an opposed manner respectively, wherein:
a low concentration region is arranged in contact between one channel region and one impurity doped region which are adjacent to each other, the low concentration region being doped with the first impurity or with a second impurity, different than the first impurity and having an impurity concentration lower than an impurity concentration of the one impurity doped region, and
the low concentration region is comprised of a first low concentration region which is arranged adjacent to the one impurity doped region and a second low concentration region which is arranged adjacent to the channel region and which has an impurity concentration lower than the impurity concentration of the first low concentration region.

2. A display device according to claim 1, wherein the low concentration regions are arranged in contact between any one of the one or more channel regions and any one of the impurity doped regions adjacent to each other.

3. A display device according to claim 1, wherein at least a portion of the first low concentration region expands outside a region of the semiconductor film which faces the gate electrode in an opposed manner.

4. A display device according to claim 3, wherein the second low concentration region is covered with the region of the semiconductor film which faces the gate electrode in an opposed manner.

5. A display device according to claim 1, wherein the impurity concentration of the first low concentration region is set to $1\times10^{18}$ to $1\times10^{19}$ atom/cm$^3$, and the impurity concentration of the second low concentration regions is set to not more than 50% of the impurity concentration of the first low concentration region.

6. A display device according to claim 1, wherein the semiconductor film includes two channel regions.

7. A display device according to claim 1, wherein the light source comprises a backlight.

* * * * *